(12) United States Patent
Russo

(10) Patent No.: US 10,614,862 B2
(45) Date of Patent: Apr. 7, 2020

(54) ASSEMBLIES COMPRISING MEMORY CELLS AND SELECT GATES

(71) Applicant: Micron Technology, Inc., Boise, ID (US)

(72) Inventor: Ugo Russo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/926,427

(22) Filed: Mar. 20, 2018

(65) Prior Publication Data

US 2019/0198065 A1    Jun. 27, 2019

Related U.S. Application Data

(60) Provisional application No. 62/609,884, filed on Dec. 22, 2017.

(51) Int. Cl.
| | |
|---|---|
| *G11C 5/02* | (2006.01) |
| *G11C 7/10* | (2006.01) |
| *G11C 19/32* | (2006.01) |
| *H01L 27/11524* | (2017.01) |
| *H01L 27/11582* | (2017.01) |
| *G11C 8/12* | (2006.01) |
| *G11C 16/08* | (2006.01) |
| *G11C 11/56* | (2006.01) |

(52) U.S. Cl.
CPC .......... *G11C 7/1006* (2013.01); *G11C 7/1096* (2013.01); *G11C 8/12* (2013.01); *G11C 16/08* (2013.01); *G11C 19/32* (2013.01); *H01L 27/11524* (2013.01); *H01L 27/11582* (2013.01); *G11C 11/5621* (2013.01)

(58) Field of Classification Search
CPC ....... G11C 16/0483; G11C 5/02; G11C 5/025; H01L 27/11524; H01L 27/11578; H01L 27/11851; H01L 27/0688
USPC .................................................... 365/185.17
See application file for complete search history.

(56) References Cited

U.S. PATENT DOCUMENTS

2018/0138194 A1* 5/2018 Shigemura ........ H01L 21/28008

OTHER PUBLICATIONS

Azom, Silicon Nitride (Si3N4) Properties and Applications, Feb. 6, 2001 (Year: 2001).*

(Continued)

*Primary Examiner* — Alfredo Bermudez Lozada
(74) *Attorney, Agent, or Firm* — Wells St. John P.S.

(57) ABSTRACT

An assembly having a stack of alternating dielectric levels and conductive levels. Channel material pillars extend through the stack. Some of the channel material pillars are associated with a first sub-block, and others of the channel material pillars are associated with a second sub-block. Memory cells are along the channel material pillars. An insulative level is over the stack. A select gate configuration is over the insulative level. The select gate configuration includes a first conductive gate structure associated with the first sub-block, and includes a second conductive gate structure associated with the second sub-block. The first and second conductive gate structures are laterally spaced from one another by an intervening insulative region. The first and second conductive gate structures have vertically-spaced conductive regions, and have vertically-extending conductive structures which electrically couple the vertically-spaced conductive regions to one another.

27 Claims, 17 Drawing Sheets

(56) References Cited

OTHER PUBLICATIONS

Azom, Alumina Al2O3—Properties of Aluminum Oxide, Apr. 12, 2007 (Year: 2007).*
Wolf, et al. "chemical Vapor Deposition of Amorphous and Polycrystalline Films", Silicon Processing for the VLSI Era, vol. 1: Process Technology, U.S. (Jan. 1986), p. 191.

* cited by examiner

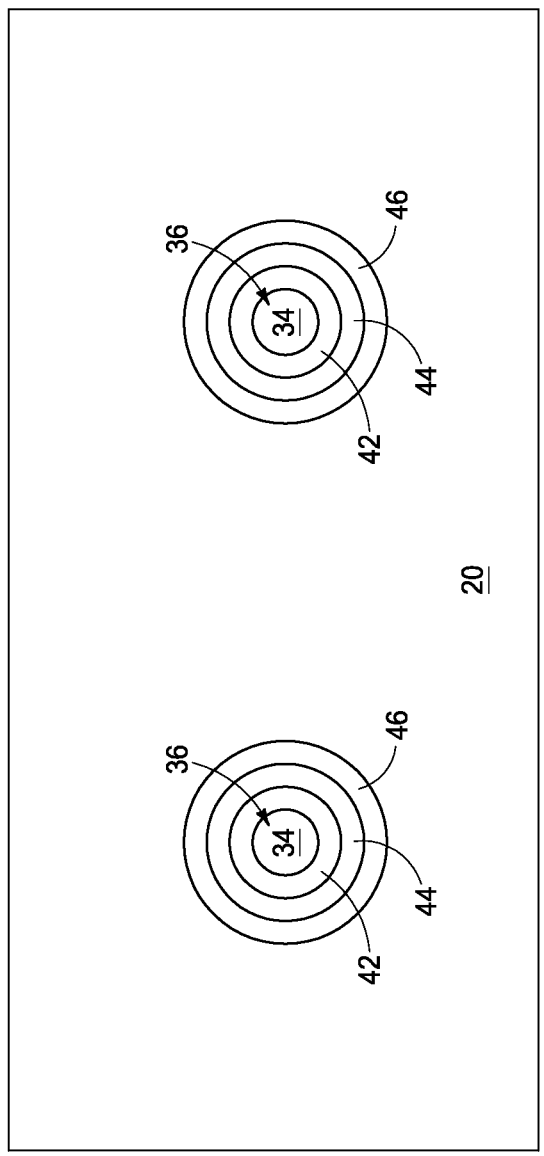

ASSEMBLIES COMPRISING MEMORY CELLS AND SELECT GATES

RELATED PATENT DATA

This patent is related to U.S. Provisional Patent Application Ser. No. 62/609,884, which was filed Dec. 22, 2017, and which is hereby incorporated herein by reference.

TECHNICAL FIELD

Assemblies comprising memory cells and select gates; such as assemblies comprising drain-side select gates (SGDs) over NAND memory cells. Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. Memory control unit 1018 controls memory operations performed on the memory cells 1003 utilizing signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

BRIEF DESCRIPTION OF THE DRAWINGS

FIG. 6A is a cross-sectional view along the line A-A of FIG. 6.

DETAILED DESCRIPTION OF THE ILLUSTRATED EMBODIMENTS

Some embodiments include new methods of fabricating drain-side select gates (SGDs), and new architectures formed utilizing such methods. An example method is described with reference to FIGS. 5-16, and an example architecture is described with reference to FIG. 16.

Figure 5:
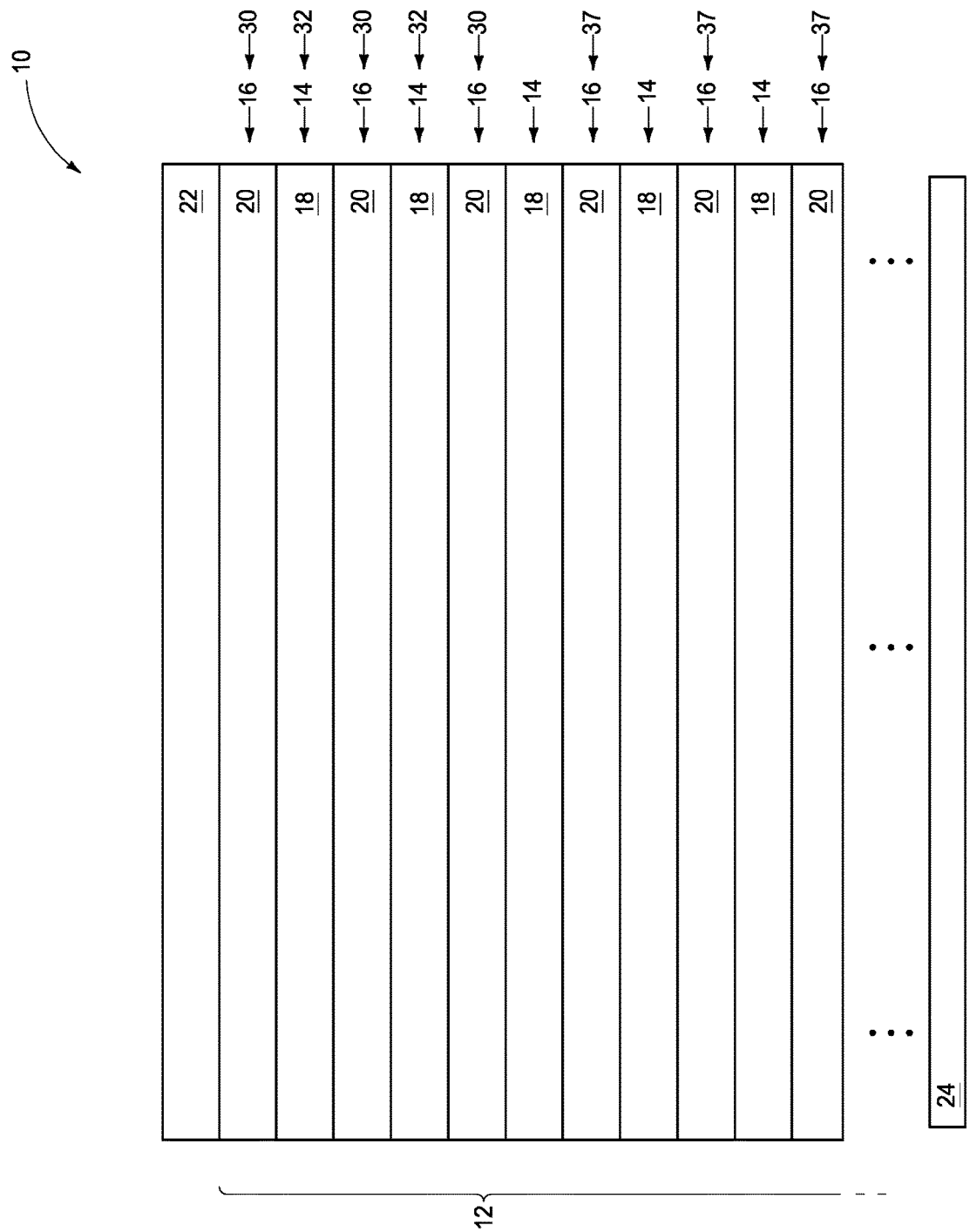
FIGS. 5-16 are diagrammatic cross-sectional views of an example construction at example process stages of an example method for forming an example assembly.

Referring to FIG. 5, a construction 10 includes a stack 12 of alternating first and second levels 14 and 16. The first levels 14 comprise dielectric material 18 (e.g., silicon dioxide), and the second levels 16 comprise sacrificial material 20 (e.g., silicon nitride). The dielectric material 18 may be referred to as first dielectric material to distinguish it from other dielectric materials that will be formed at later process stages.

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 300 nm.

A masking material 22 is over the stack 12. The masking material may comprise any suitable composition(s), and in some embodiments may comprise amorphous carbon. The masking material 22 may be utilized to form a hard mask.

Two or more upper second levels 16 of the stack 12 may be referred to as gate levels 30, in that they are ultimately incorporated into drain-side select gates (SGDs). Others of the second levels 16 may be referred to as wordline levels 37, in that they are ultimately incorporated into wordlines. The wordlines may comprise control gates for the memory cells; such as vertically-stacked memory cells of NAND strings. The number of memory cell levels in the individual strings is determined by the number of wordlines. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The first levels 14 between the gate levels 30 may be referred to as intervening levels 32 (or as intervening first levels).

The stack 12 shown to be supported over a base 24. The base 24 may comprise semiconductor material; and may, for example, comprise, consist essentially of, or consist of monocrystalline silicon. The base 24 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 24 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 24 to indicate that other components and materials may be provided between the stack 12 and the base 24. Such other components and materials may comprise additional levels of the stack, a source line level, source-side select gates (SGSs), etc.

Figure 6:
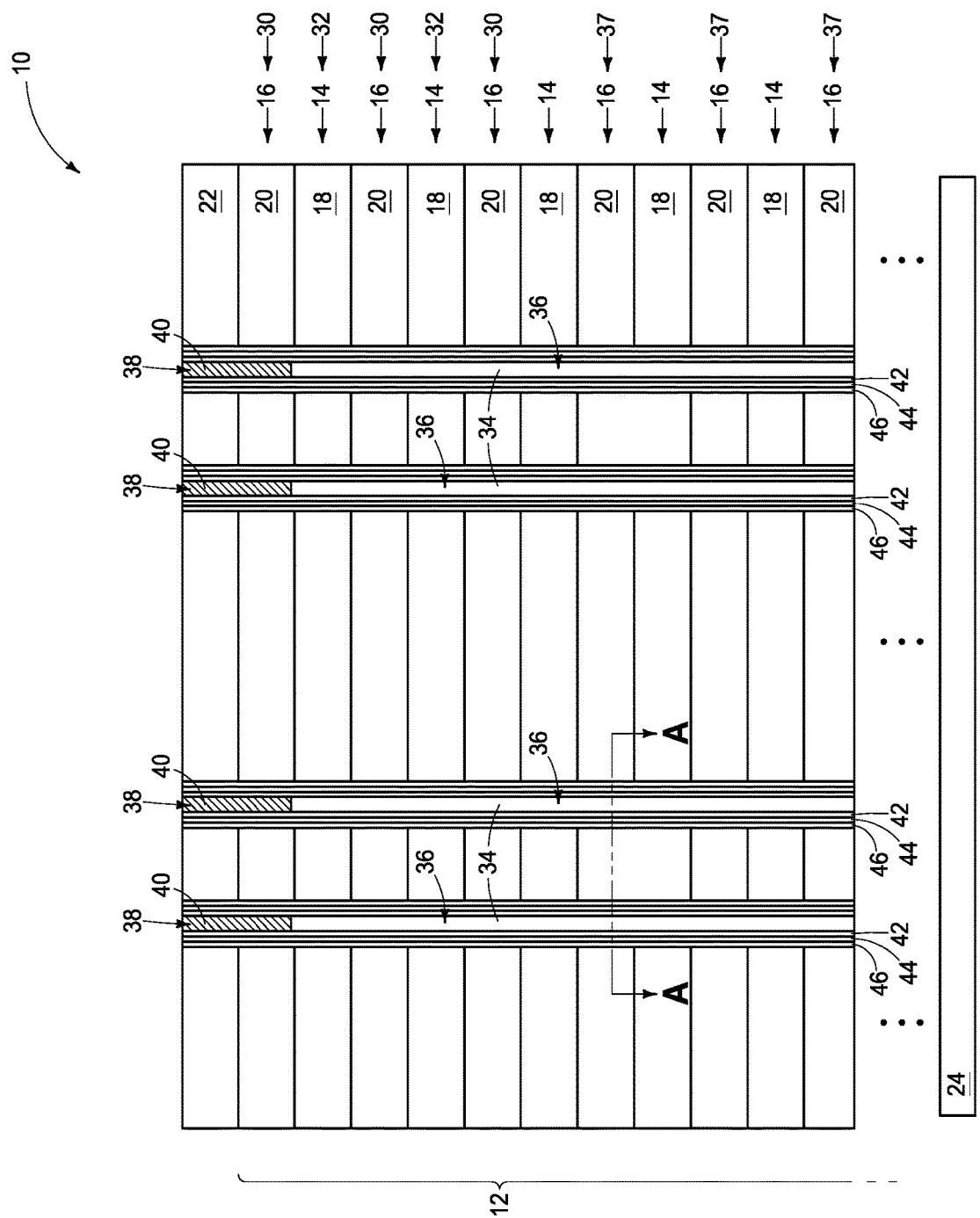

Referring to FIG. 6, channel material 34 is provided in the form of pillars 36. In the illustrated embodiment, the channel material pillars 36 are solid pillars. In other embodiments, the channel material pillars may be so-called hollow pillars (i.e., may comprise channel material surrounding an insulative core).

The channel material pillars 36 are capped by conductive interconnects 38. The conductive interconnects 38 comprise electrically conductive material 40. The material 40 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 40 may comprise, consist such of, or consist of conductively-doped silicon.

The channel material 34 may comprise any suitable appropriately-doped semiconductor material(s); and in some embodiments may comprise one or more of silicon, germanium, III/V semiconductor materials (e.g., gallium phosphide), semiconductor oxides, etc.

The channel material pillars 34 extend into the stack 12, and in the shown embodiment extend through two of the gate levels 30, and two of the intervening levels 32. Generally, the channel material pillars 34 extend through at least one of the gate levels 30, and through at least one of the intervening levels 32.

Tunneling material 42, charge-storage material 44, and charge-blocking material 46 are formed along the channel material pillars 36.

The tunneling material 16 is sometimes referred to as gate dielectric. The tunneling material 16 may comprise any suitable composition(s); and in some embodiments may comprise, for example, one or more of silicon dioxide, aluminum oxide, hafnium oxide, zirconium oxide, etc.

The charge-storage material 18 may comprise any suitable composition(s); and in some embodiments may comprise charge-trapping materials, such as silicon nitride, silicon oxynitride, conductive nanodots, etc. In alternative embodiments (not shown), charge-storage material 26 may be configured as floating gate material (such as, for example, polycrystalline silicon).

The charge-blocking material 46 may comprise any suitable composition(s); and in some embodiments may comprise one or more of silicon dioxide, aluminum oxide, hafnium oxide, zirconium oxide, etc.

FIG. 6A shows a cross-section along the line A-A of FIG. 6, and shows an example configuration of the channel material pillars 36, the tunneling material 42, the charge-storage material 44 and the charge-blocking material 46.

Figure 7:
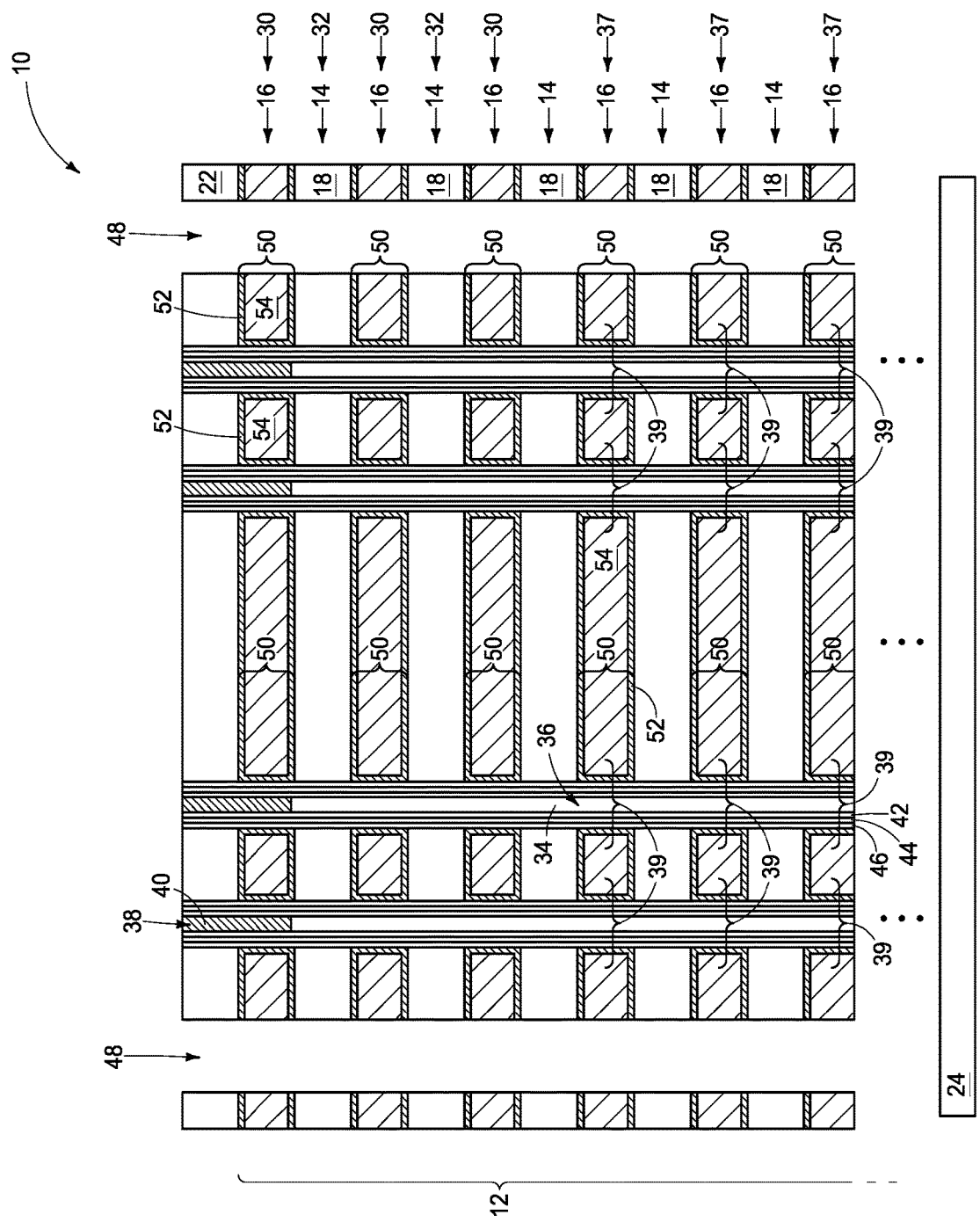

Referring to FIG. 7, slits 48 are formed to extend through the stack 12. The slits 48 may be configured as trenches extending in and out of the page relative to the cross-sectional view of FIG. 7. After the slits 48 are formed, the sacrificial material 20 (FIG. 6) is removed and replaced with conductive material 50.

The conductive material 50 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In the shown embodiment, the conductive material 50 comprises a first composition 52 and a second composition 54. The first composition 52 may comprise, consist essentially, or consist of a metal nitride (e.g., titanium nitride); and the second composition 54 may comprise, consist essentially of, or consist of a metal (e.g., tungsten). In some embodiments, the conductive material 50 may be referred to as a first conductive material to distinguish it from other conductive materials formed at later process stages.

The conductive material 50 forms wordlines along the wordline levels 37. Regions of the wordlines along the channel material pillars 36 become control gates of memory cells 39; with such memory cells comprising the channel material 34, tunneling material 42, charge-storage material 44 and charge-blocking material 46. The memory cells may be vertically-stacked NAND memory cells of a three-dimensional NAND memory array. The NAND memory cells 39 along a common channel material pillar 36 may be a string of the NAND memory cells.

In some embodiments, barrier material (not shown) may be provided between the conductive material 50 and the charge-blocking material 46. The barrier material may be along regions where the conductive material 50 is adjacent the charge-blocking material 46. The charge-blocking material 46 may provide a mechanism to block charge from migrating from the charge-trapping material 44 to the control gates of memory cells 39, and the barrier material may provide a mechanism which prevents back-migration of electrons from the control gates into the charge-trapping material. The barrier material may be formed as liners extending along outer edges of the conductive material 50 in some embodiments. The barrier material may comprise any suitable composition(s); and in some embodiments may comprise one or more of aluminum oxide, hafnium oxide, zirconium oxide, niobium oxide, etc.

Figure 8:
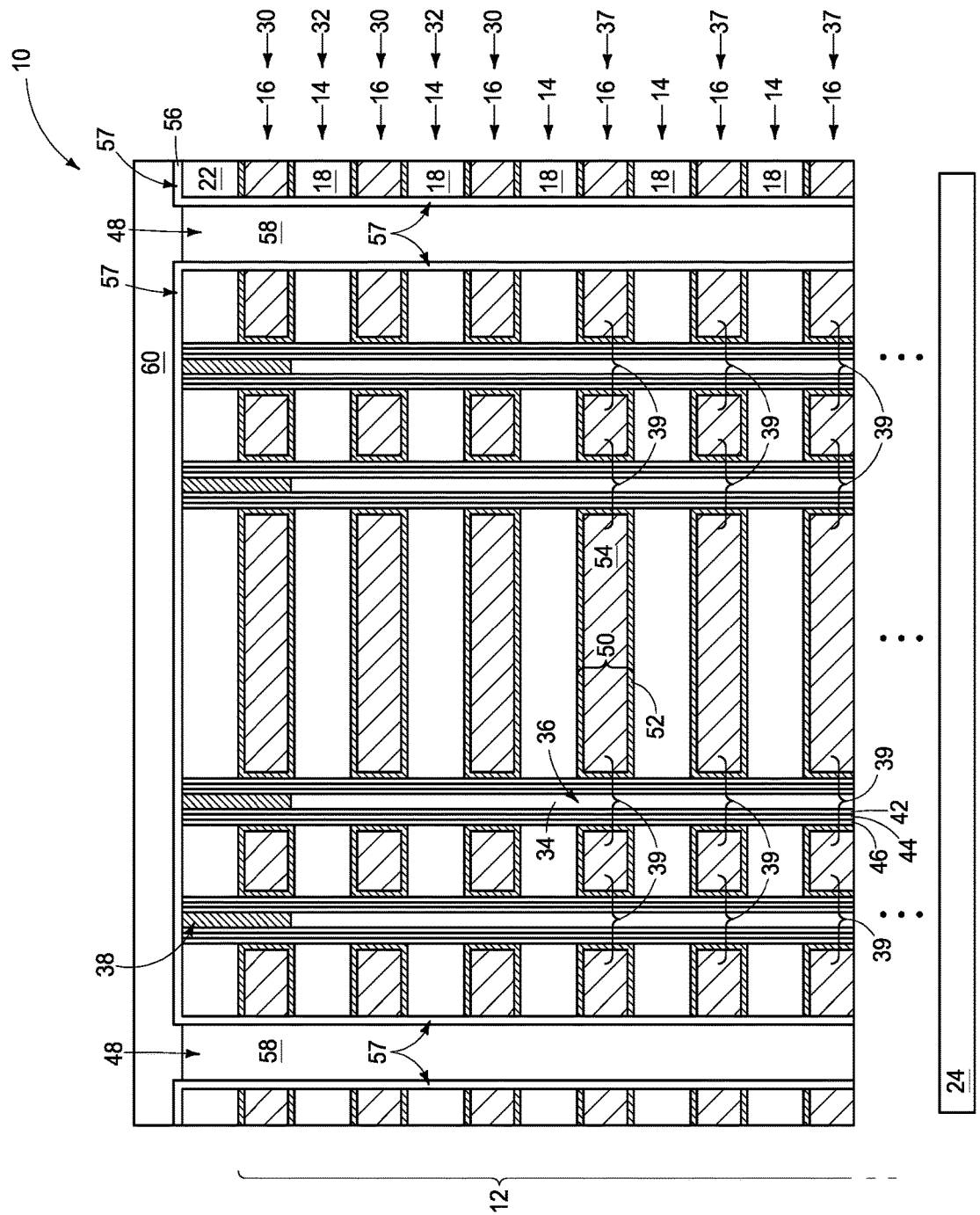

Referring to FIG. 8, the slits 48 are filled with insulative materials 56 and 58. In some embodiments, the material 56 may be referred to as outer liner 57 provided along edges of the slits 48, and the material 58 may be referred to as an inner material provided within the slits along the outer liner 57.

The insulative material 56 may comprise any suitable composition or combination of compositions; and in some embodiments may comprise, consist essentially of, or consist of silicon nitride. The insulative material 58 may comprise any suitable composition or combination of compositions; and in some embodiments may comprise, consist essentially of, or consist of silicon dioxide. Accordingly, in some embodiments the insulative 58 may comprise a same composition as the insulative material 18 of the dielectric levels 14.

In the illustrated embodiment, a protective capping material 60 is formed across upper surfaces of the insulative material 58. The protective capping material 60 may protect the insulative material 58 from being etched during a subsequent etch utilized to remove insulative material 18 (with the subsequent etch being shown and described relative to FIG. 10). If the insulative material 58 comprises a different composition relative to the material 18, and would not be removed with the subsequent etched utilized to remove the material 18, then the protective capping layer 60 may be omitted.

Figure 9:
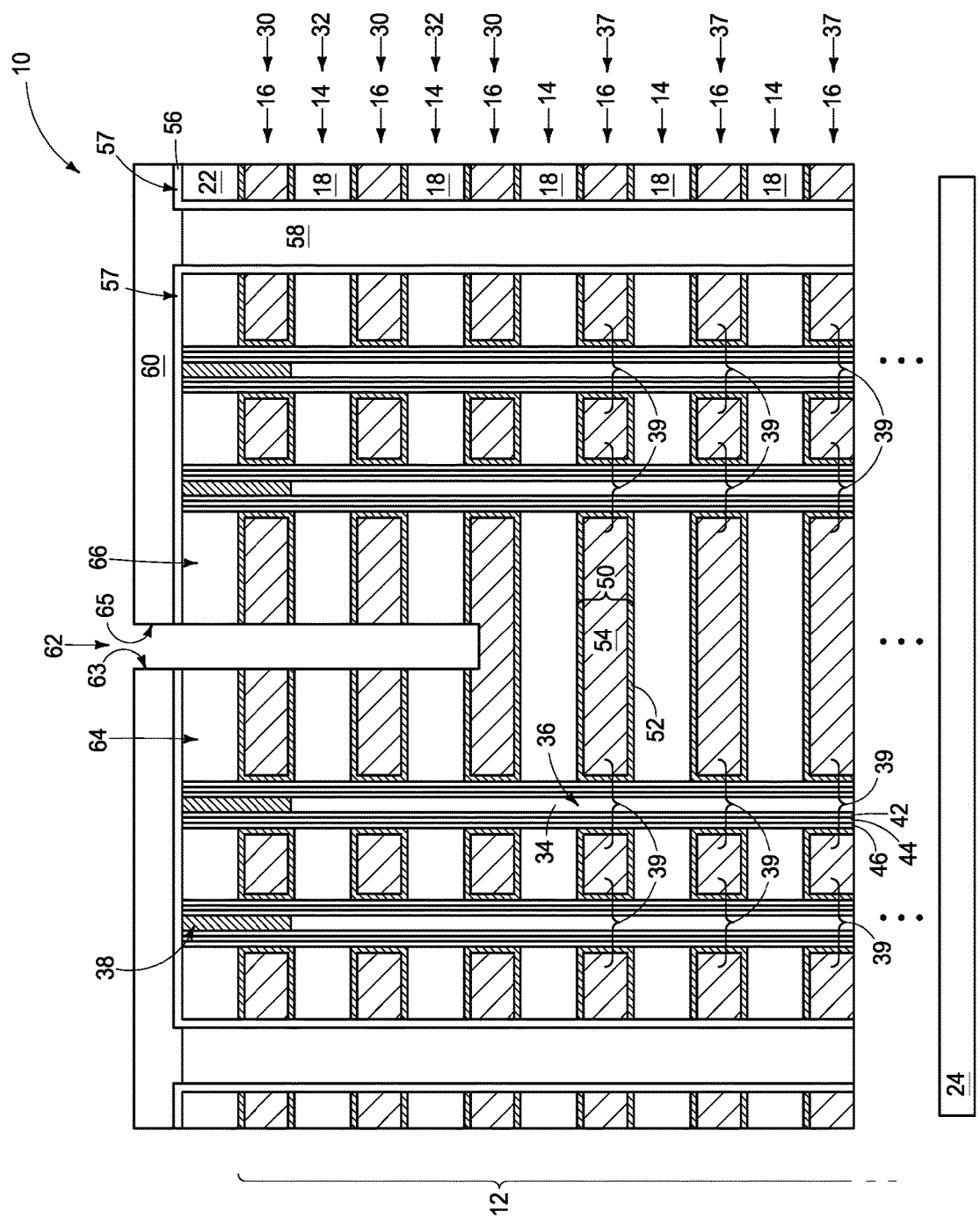

Referring to FIG. 9, an opening 62 is formed to extend through at least some of the gate levels 30, and through the intervening levels 32. In the illustrated embodiment, the opening 62 extends only partially into the bottommost of the gate levels. In other embodiments, the opening 62 may extend entirely through such bottommost of the gate levels.

The opening 62 may be referred to as a first opening distinguish it from another opening formed at a later process stage.

The first opening 62 may be considered to comprise a first side 63 and an opposing second side 65 along the cross-section of FIG. 9. The opening 62 may be considered to define a first gate 64 along the first side 63 of the opening, and to define a second gate 66 along the second side 65 of the opening. The first and second gates 64 and 66 defined by the opening 62 will ultimately become SGD gates. However, such gates are not fully fabricated at the process stage of FIG. 9. Instead, the locations of the gates 64 and 66 are defined by the formation of the opening 62.

The first opening 62 may have any suitable shape. In some embodiments, the opening may be a trench which extends in and out of the page relative to the cross-section of FIG. 9.

Figure 10:
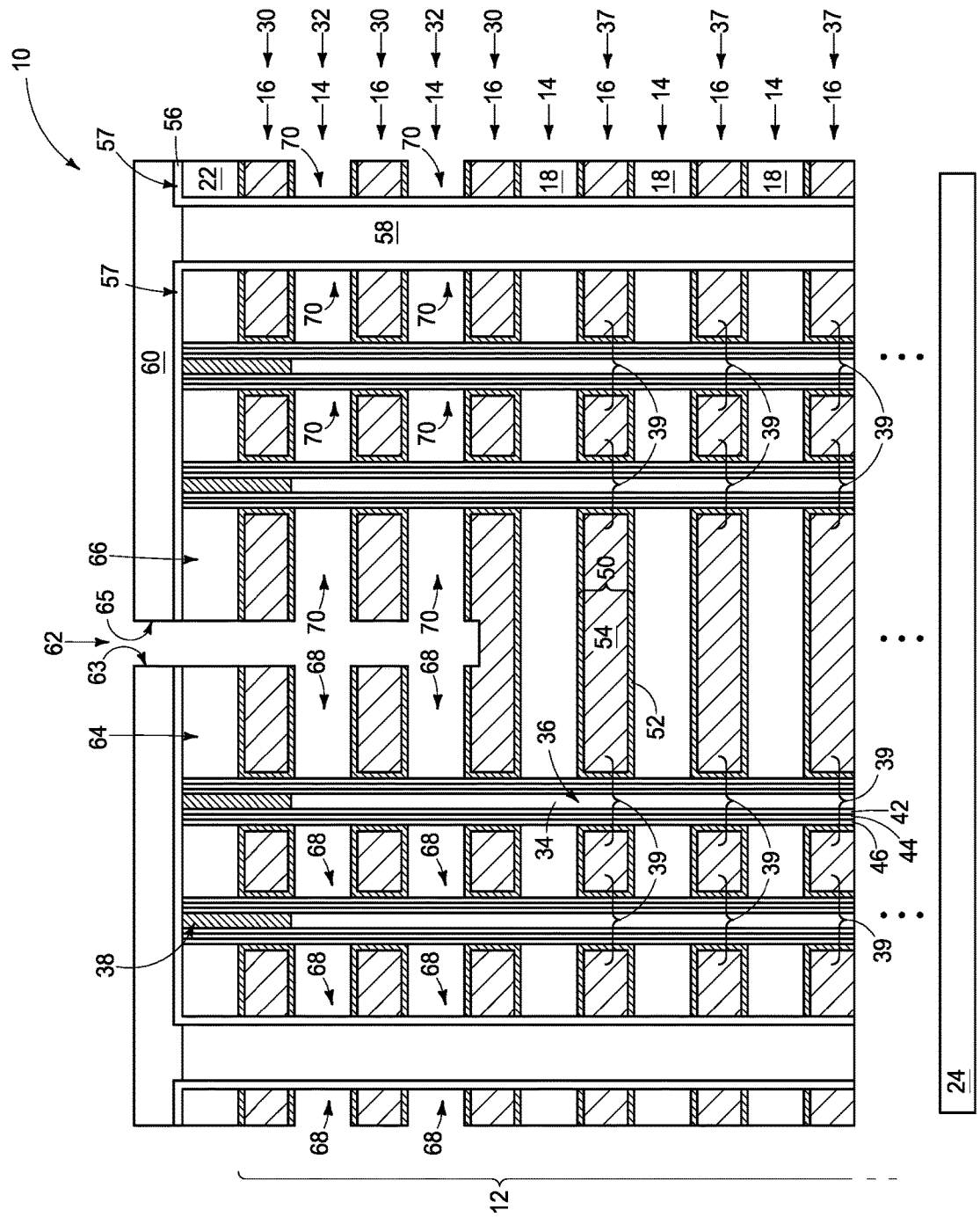

Referring to FIG. 10, the dielectric material 18 is removed from the intervening levels 32 to form first voids 68 along the first side 63 of the opening 62, and to form second voids 70 along the second side 65 of the opening 62. In some embodiments, the insulative material 18 may comprise silicon dioxide (as discussed above). In such embodiments, the voids 68 and 70 may be formed with a wet etch of the silicon dioxide.

The protective capping material 60 may protect the insulative material 58 from being removed during the etching of material 18, as discussed above in explaining the purpose of the protective capping material 60.

Figure 11:
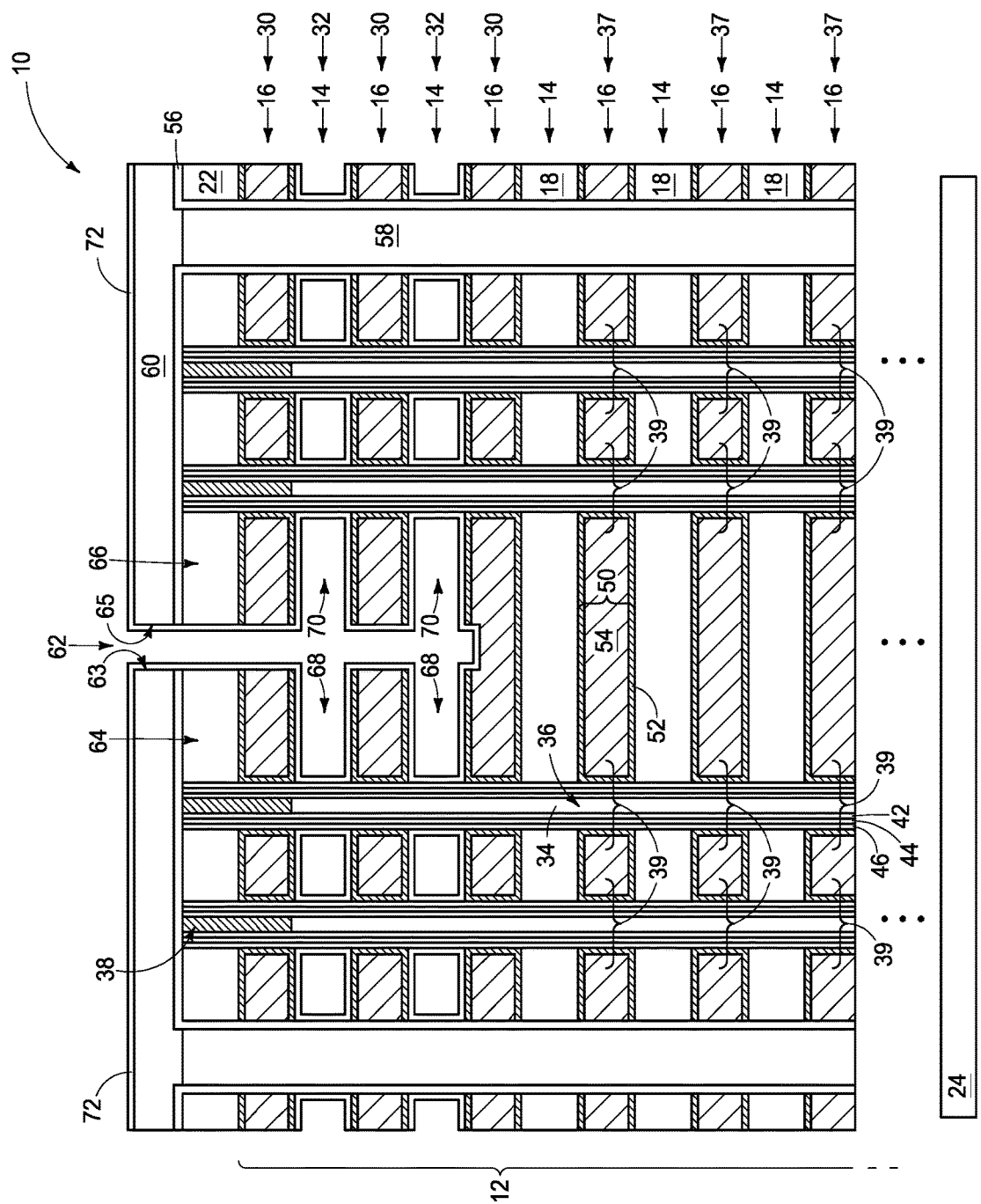

Referring to FIG. 11, the voids 68 and 70 are lined with dielectric material 72. In some embodiments, the dielectric materials 18 and 72 may be referred to as first and second dielectric materials, respectively, to distinguish them from one another.

The dielectric material 72 may comprise any suitable composition(s). For instance, in some embodiments the dielectric material 72 may comprise, consist essentially of, or consist of silicon dioxide. As another example, in some embodiments the dielectric material 72 may comprise a high-k oxide, where the term "high-k" means a dielectric constant greater than that of silicon oxide. For instance, in some embodiments the dielectric material 72 may comprise, consist essentially of, or consist of one or more of aluminum oxide, hafnium oxide, zirconium oxide, etc.

In some embodiments, the etching utilized to form the voids 68 and 70 may adversely remove some of the charge-blocking material 46 from along the channel material pillars 36. The dielectric material 72 may comprise a same composition as the charge-blocking material, and may be utilized to replace any of the charge-blocking material which may have been removed during formation of the voids 68 and 70.

In some embodiments, the dielectric material 72 may be omitted.

Figure 12:
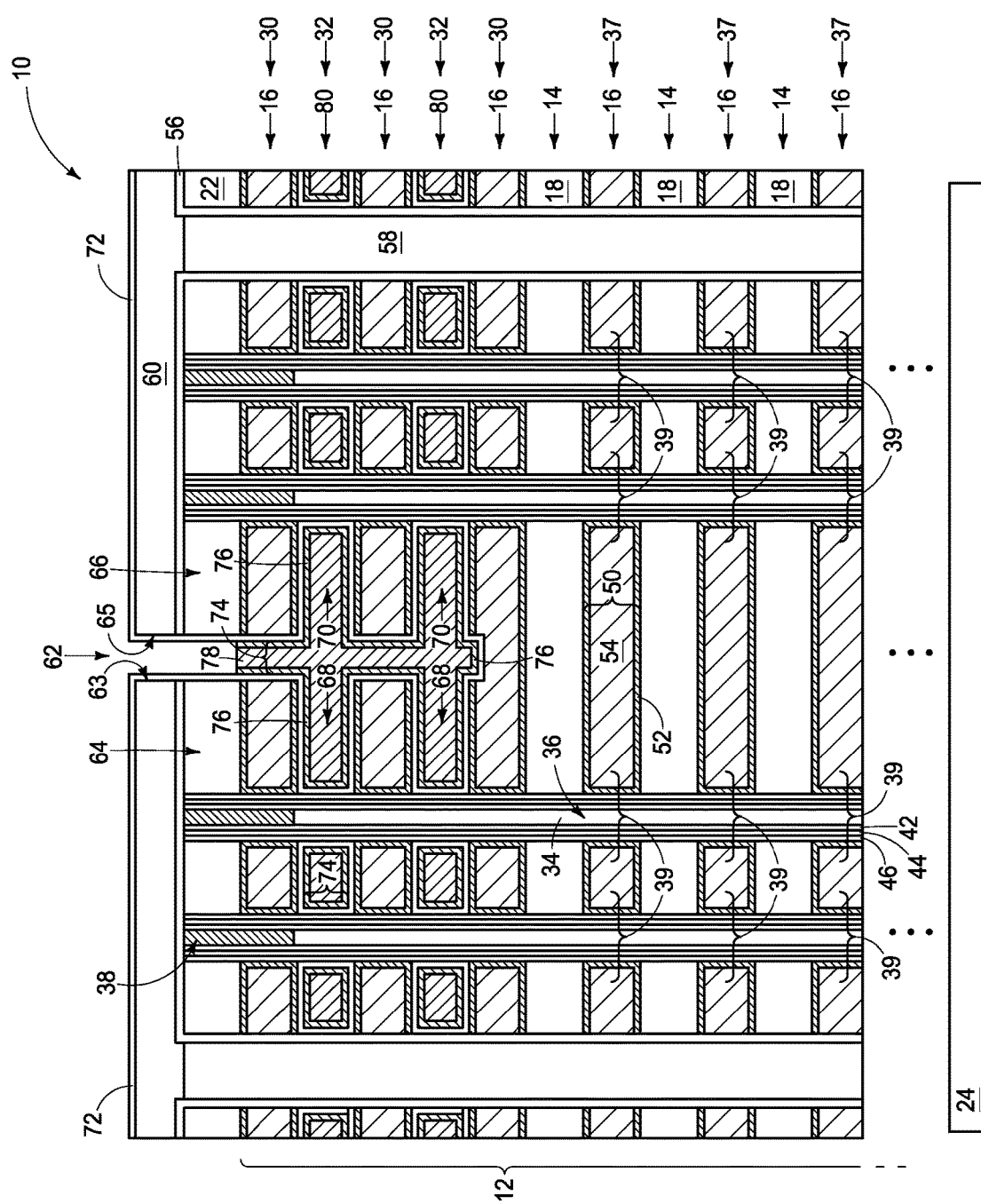

Referring to FIG. 12, conductive material 74 is formed within the opening 62, and within the first and second void 68 and 70. The conductive material 74 may be referred to as a second conductive material to distinguish it from the first conductive material 50.

In the shown embodiment, the conductive material 74 comprises a first composition 76 and a second composition 78. In some embodiments, the conductive material 74 may comprise the same compositions as the conductive material 50. Accordingly, the composition 76 of conductive material 74 may be the same as the composition 52 of conductive material 50; and may, for example, comprise, consist essentially of, or consist of metal nitride (e.g., titanium nitride). Also, the composition 78 of conductive material 74 may be the same as the composition 54 of conductive material 50; and may, for example, comprise, consist essentially of, or consist of metal (e.g., tungsten). In some embodiments, the composition 76 of conductive material 74 may be referred to as a liner, and the composition 78 may be referred to as a core material formed along such liner.

The second conductive material 74 within the voids 68 and 70 may be considered to form additional gate levels 80 along the intervening regions 32.

Figure 13:
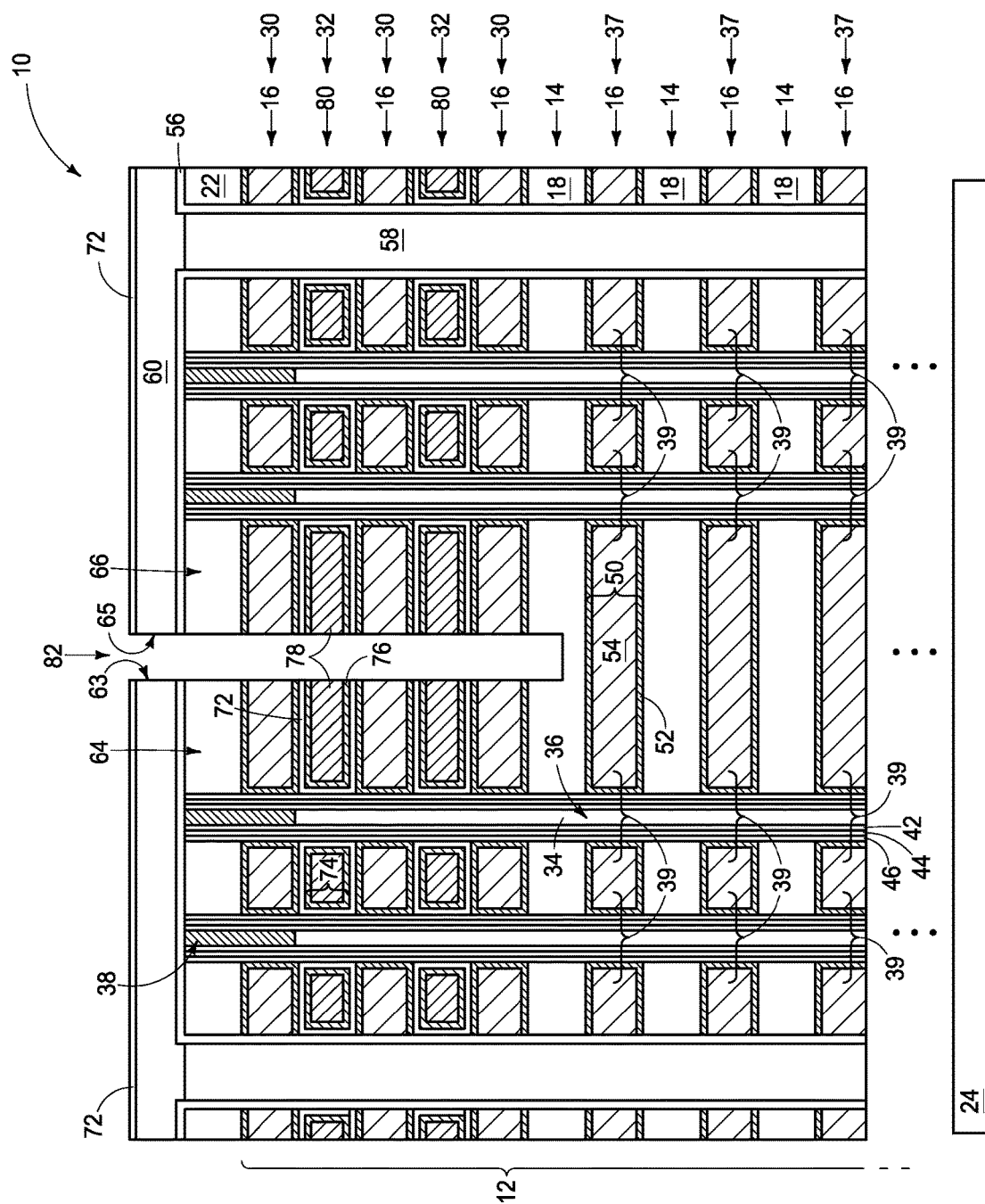

Referring to FIG. 13, an opening 82 is formed through the second conductive material 74, with such opening punching through the bottommost of the gate levels 30. The opening 82 may be referred to as a second opening to distinguish it from the first opening 62 described above with reference to FIG. 9.

The second opening 82 has the first side 63 and the opposing second side 65. The second opening 82 isolates the gate levels 16 and 80 along the first side 63 from the gate levels 16 and 80 along the second side 65.

Figure 14:
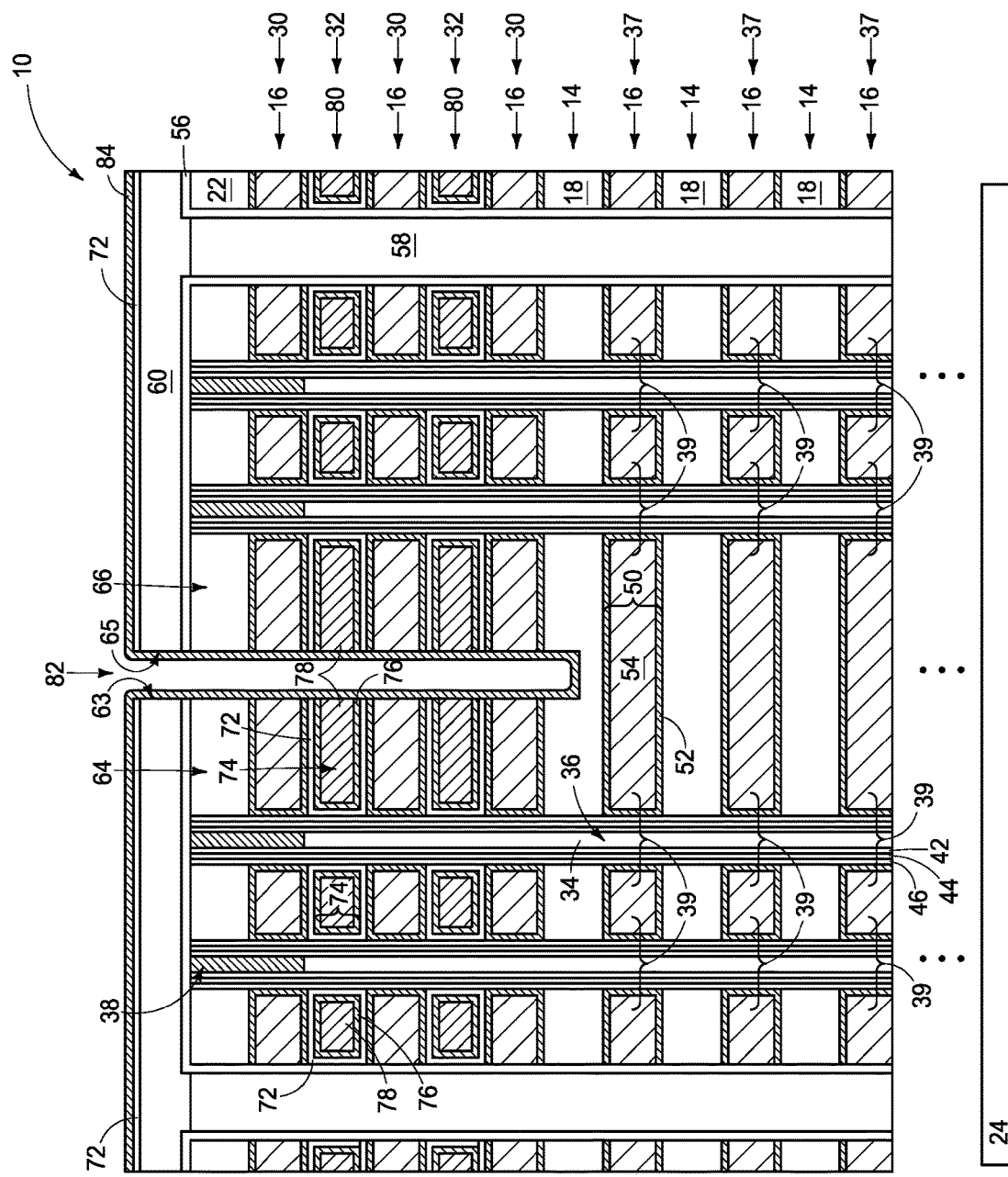

Referring to FIG. 14, the opening 82 is lined with a conductive material 84. The conductive material 84 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 84 may comprise, consist essentially of, or consist of metal (e.g., tungsten). The conductive material 84 may be referred to as a third conductive material to distinguish it from the first and second conductive materials 50 and 74.

Figure 15:
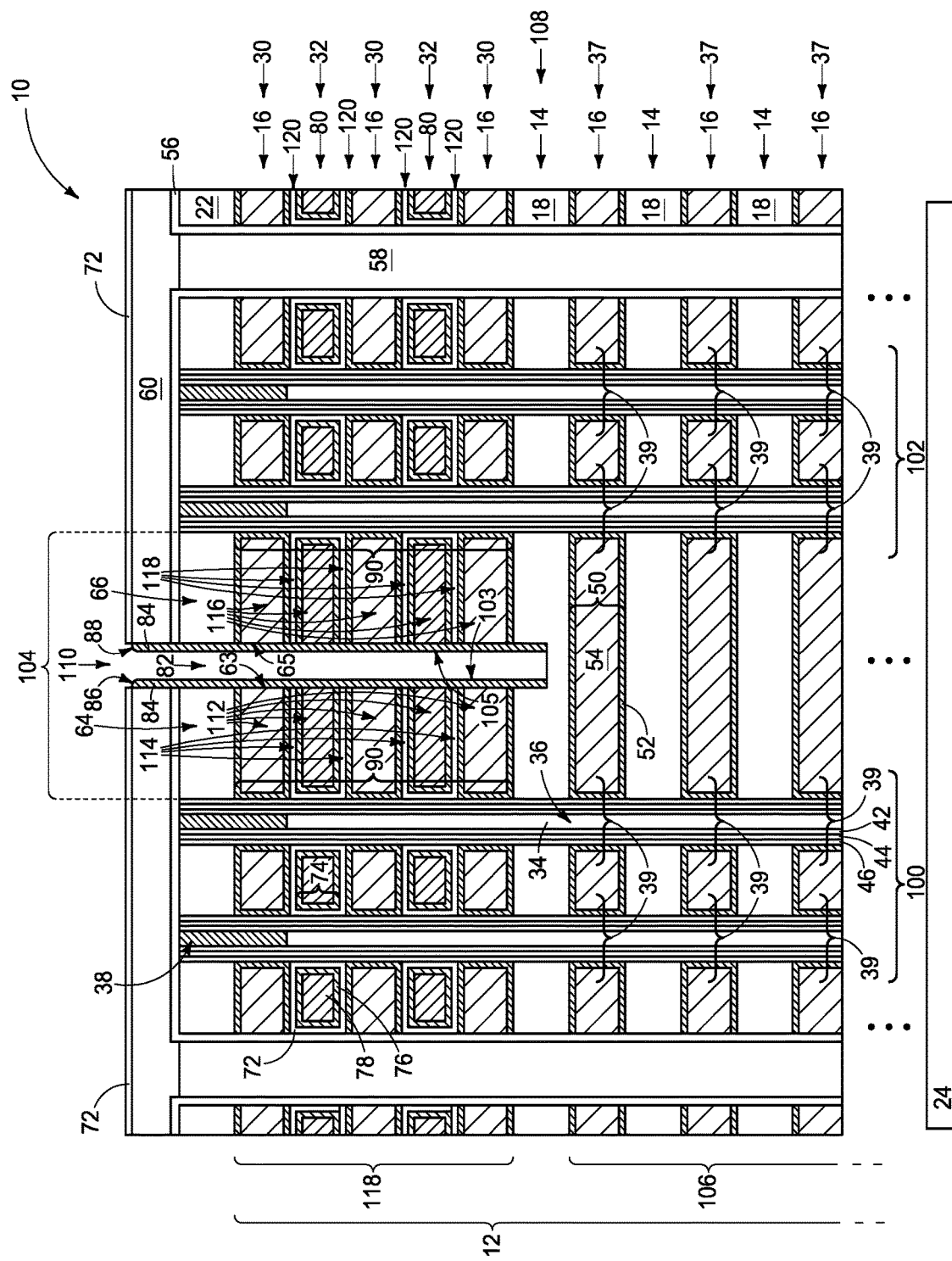

Referring to FIG. 15, the conductive material 84 is subjected to an anisotropic etch to form conductive structures 86 and 88 along sidewalls of the second opening 82. The conductive structures 86 and 88 may be referred to as first and second conductive structures, respectively. The first conductive structure 86 couples the gate levels 30 and 80 along the first side 63 of the opening 82 into a first conductive structure corresponding to the select gate 64; and the second conductive structure 88 couples the gate levels 30 and 80 along the second side 65 of the opening 82 into a second conductive structure corresponding to the select gate 66. The select gates 64 and 66 may be SGDs. An advantage of the SGDs 64 and 66 relative to conventional devices is that the SGDs 64 and 66 have long channel regions 90 due to the SGDs 64 and 66 comprising multiple conductive levels (30/80). In contrast, conventional architectures may utilize multiple short-channel SGDs in series, instead of the long-channel SGDs provided in the example embodiment architecture of FIG. 15. The long-channel SGDs may be advantageous relative to conventional SGDs in that they may alleviate or prevent short-channel effects.

The dielectric material 72 is shown to remain along the top of construction 10 after the anisotropic etch of material 84. In other embodiments, such dielectric material may be removed from over the top of the construction 10. Also, one or both of the materials 56 and 60 may be removed from over the top of construction 10.

Figure 1:
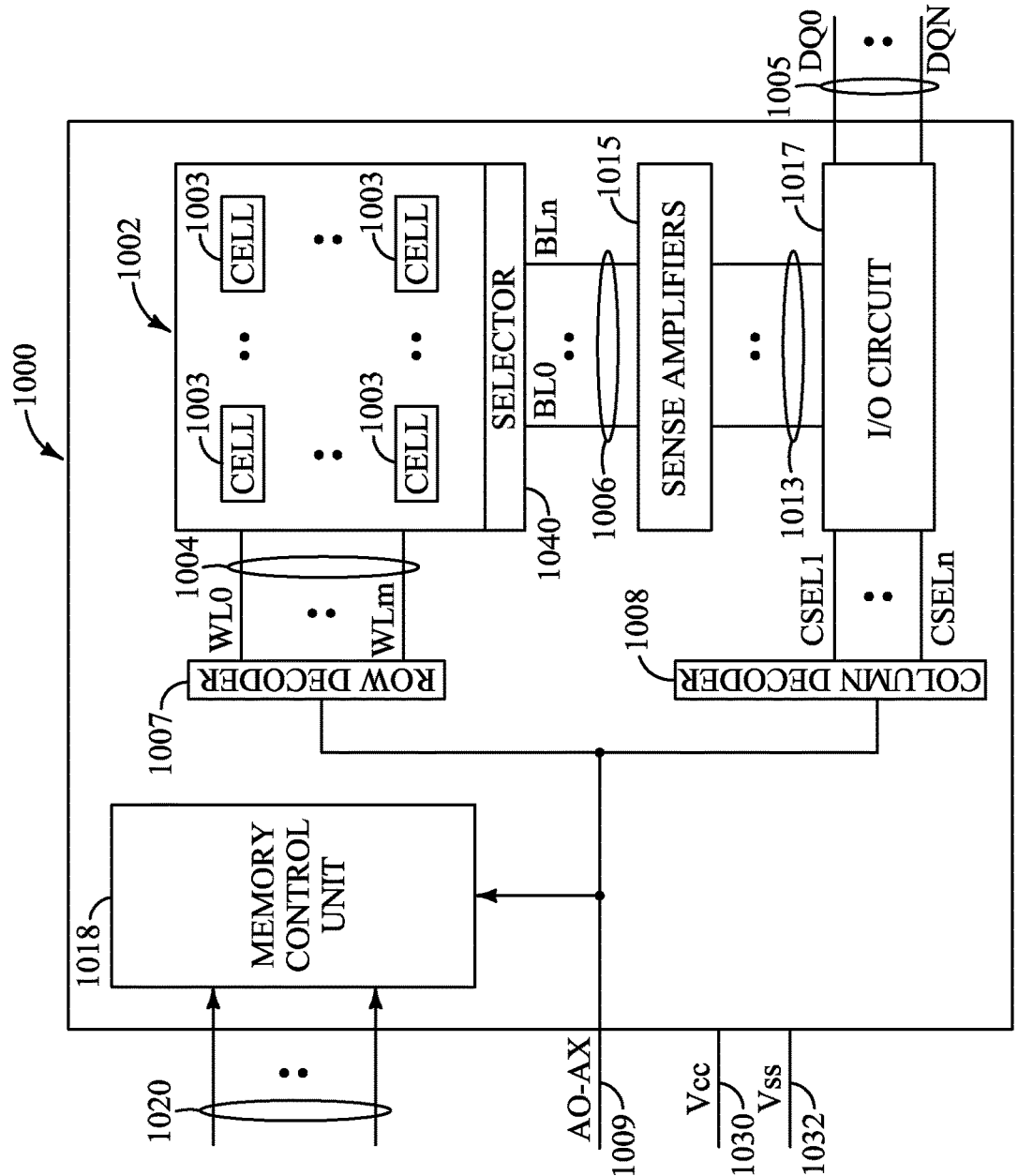
FIG. 1 shows a block diagram of a prior art memory device having a memory array with memory cells.
Figure 2:
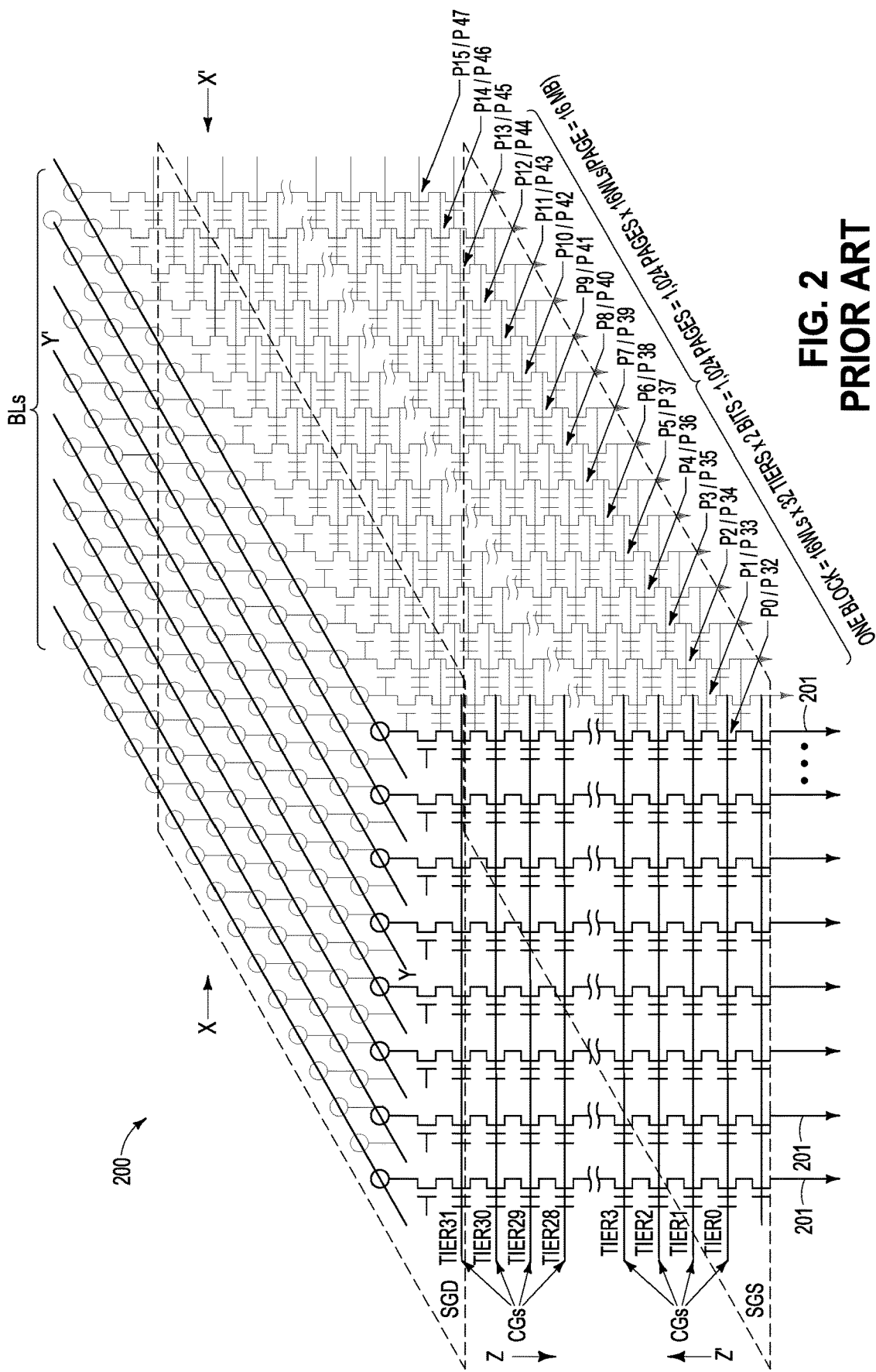
FIG. 2 shows a schematic diagram of the prior art memory array of FIG. 1 in the form of a 3D NAND memory device.
Figure 3:
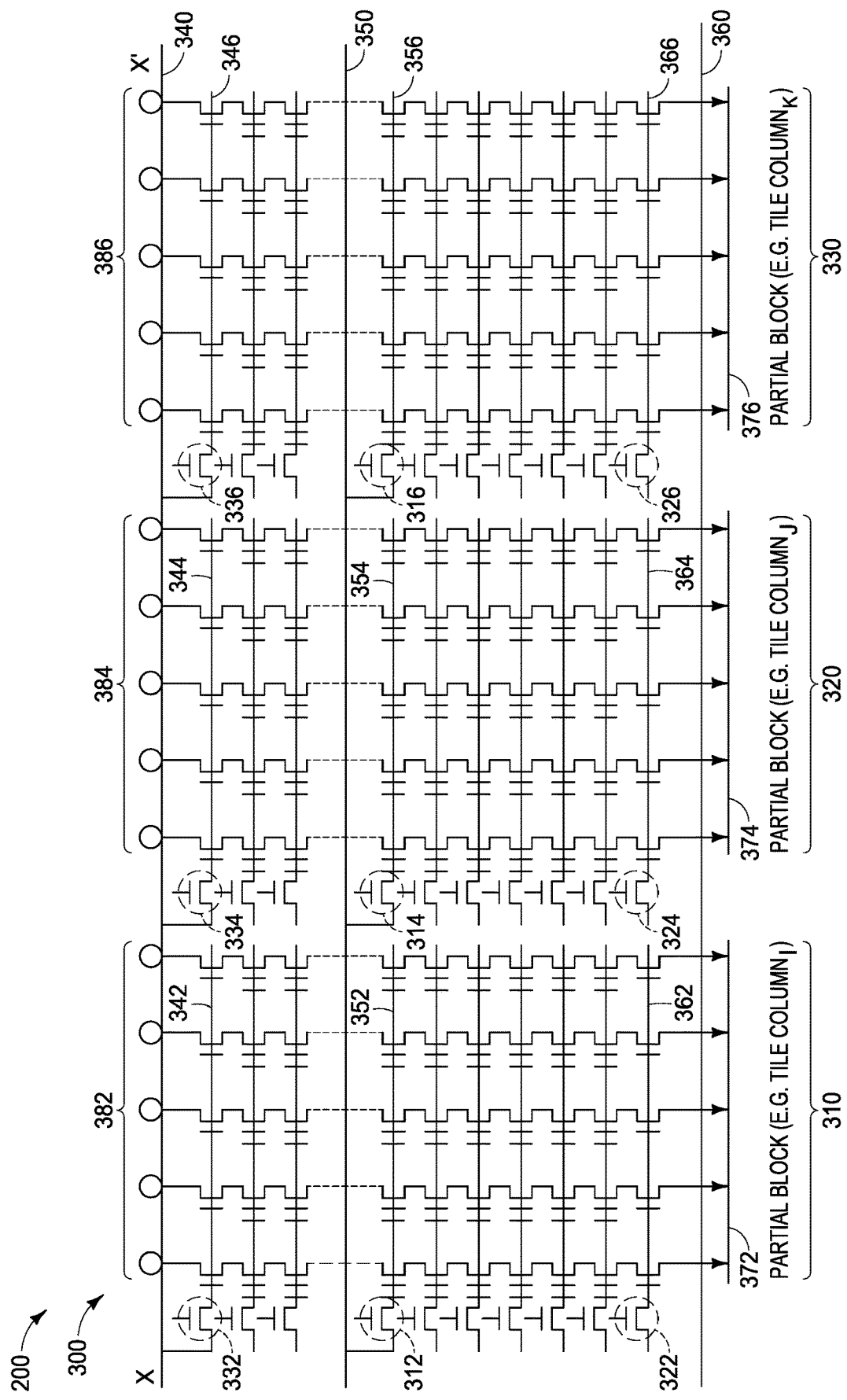
FIG. 3 shows a cross sectional view of the prior art 3D NAND memory device of FIG. 2 in an X-X' direction.
Figure 4:
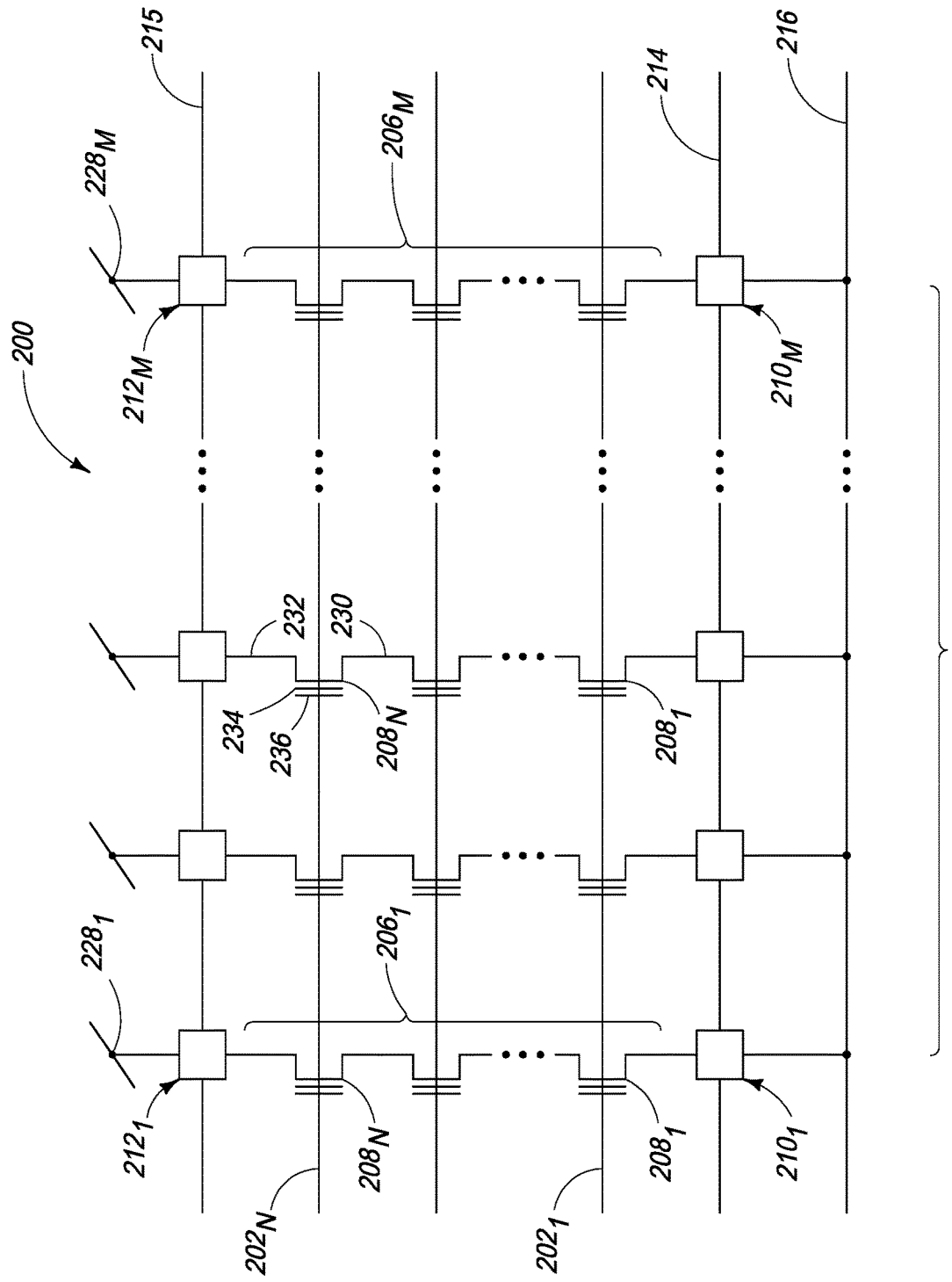
FIG. 4 is a schematic of a prior art NAND memory array.

In some embodiments, the channel material pillars 36 along the left side of the opening 82 are part of a first sub-block 100, and the channel material pillars 36 along the right side of the opening 82 are part of a second sub-block 102. The sub-blocks 100 and 102 may each correspond to a region coupled with a single sub-SGD line (such as one of the lines 342, 344 and 346 of FIG. 3). The SGD gates 64 and 66 may be together considered to be comprised by a select gate configuration 104; with such configuration having a first conductive gate structure 64 associated with the first sub-block 100, and having a second conductive gate structure 66 associated with the second sub-block.

In some embodiments, the stack 12 may be considered to comprise a first stack 106 comprising alternating insulative levels 14 and conductive levels 37. The channel material pillars 36 extend through the first stack, and the memory cells 39 are along the channel material pillars within the first stack. An insulative level 108 is over the first stack 106. The select gate configuration 104 is over the insulative level 108.

In some embodiments, the select gate configuration 104 may be considered to comprise the first and second conductive gate structures 64 and 66 laterally spaced from one another by an intervening insulative region 110 along the cross-section of FIG. 15. The first conductive structure 64 is along a first side 103 of the intervening insulative region 110, and the second conductive structure 66 is along an opposing second side 105 of the intervening insulative region.

The intervening insulative region 110 is a void region at the processing stage of FIG. 15, but may be filled with insulative material (as discussed below with reference to FIG. 16).

The first conductive gate structure 64 has vertically-spaced conductive regions 112, which are separated from one another by dielectric regions 114. The first conductive structure 64 also has the vertically-extending conductive structure 86 which electrically couples the vertically-spaced conductive regions 112 with one another. Similarly, the second conductive gate structure 66 comprises the vertically-spaced conductive regions 116, which are separated from one another by dielectric regions 118; and has the vertically-extending conductive structure 88 coupling the vertically-spaced conductive regions 118 with one another.

In the illustrated embodiment of FIG. 15, the intervening insulative region 110 includes a bottom portion which penetrates into the insulative level 108. In other embodiments, the intervening insulative region 110 may extend to an upper surface of the insulative level 108 rather than penetrating into the insulative level.

In some embodiments, the levels 30 and 32, together with the dielectric material 72 between such levels, may be considered to be a second stack 118 over the first stack 106; and specifically, over the insulative level 108. The second stack 118 may be considered to comprise the conductive levels 30 and 32 as second conductive levels; and to comprise the dielectric material 72 as second insulative levels 120 which alternate with the second conductive levels.

The channel material pillars 36 extend through the first stack 106 and into the second stack 118.

The opening 110 extends through the second stack 118, but not entirely through the insulative level 108. The opening 82 has the first side 63 and the second side 65 along the cross-section of FIG. 15. The first conductive structure 86 may be considered to be a first conductive lining along the first side 63 of the opening 82, and the second conductive structure 88 may be considered to be a second lining along the second side 65 of the opening 82.

The first conductive lining 86 couples the conductive levels 30 and 32 along the first side 63 of the opening 82 to form a first select gate 64 for the first sub-block 100; and the second conductive lining 88 couples the conductive levels 30 and 32 along the second side 65 of the opening 82 to form a second select gate 66 for the second sub-block 102.

In the embodiment of FIGS. 5-15, the first and second linings 86 and 88 are formed of the same material. In other embodiments, the first and second linings 86 and 88 may be formed of different materials relative to one another if such is desired in order to tailor the select gates 64 and 66 for specific purposes.

Figure 16:
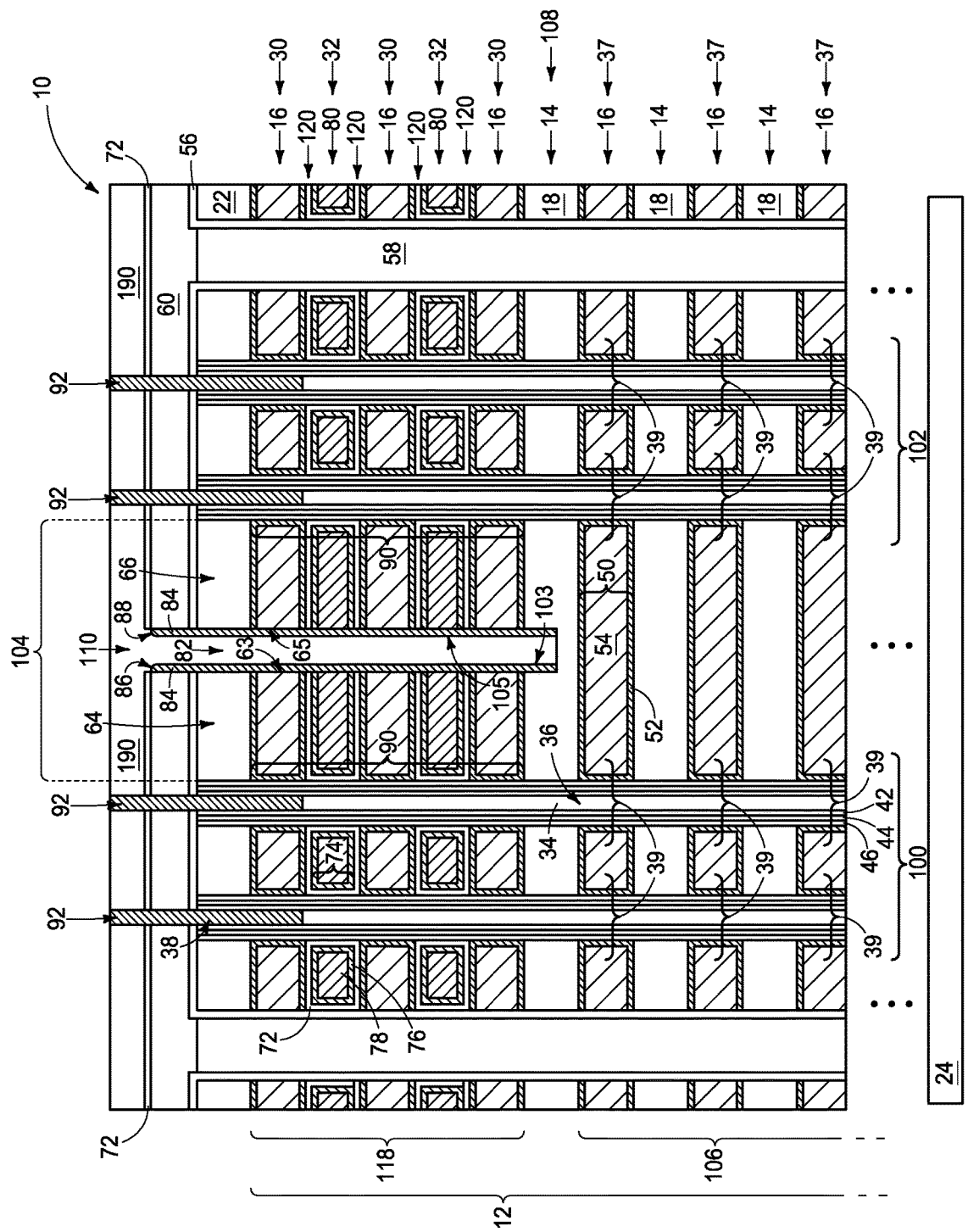

Referring to FIG. 16, insulative material 190 is formed within opening 82 and over the conductive structures 86 and 88. Also, conductive interconnects 92 are formed to extend through the insulative materials 56, 60, 72 and 190, and to connect with the interconnects 38 along the tops of the channel material pillars 36. The conductive interconnects 92 may couple the channel material pillars 36 with other circuitry (not shown in FIG. 16).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

A memory block may be understood as a smallest unit of a NAND memory array which can be erased. A sub-block may be understood as a portion of a block, and in some embodiments may be a portion tied to a single sub-SGD line (such as one of the lines 342, 344 and 346 of FIG. 3).

Some embodiments include an assembly having a stack of alternating dielectric levels and conductive levels. Channel material pillars extend through the stack. Some of the channel material pillars are associated with a first sub-block and others of the channel material pillars are associated with a second sub-block. Memory cells are along the channel material pillars. An insulative level is over the stack. A select gate configuration is over the insulative level. The select gate configuration includes a first conductive gate structure associated with the first sub-block, and includes a second conductive gate structure associated with the second sub-block. The first and second conductive gate structures are laterally spaced from one another by an intervening insulative region along a cross-section. The first conductive gate structure is along a first side of the intervening insulative region, and the second conductive gate structure is along a second side of the intervening insulative region. The second side is in opposing relation to the first side along the cross-section. The first and second conductive gate structures have vertically-spaced conductive regions separated from one another by dielectric regions, and have vertically-extending conductive structures which electrically couple the vertically-spaced conductive regions to one another.

Some embodiments include an assembly having a first stack comprising alternating first dielectric levels and first conductive levels. An insulative level is over the first stack. A select gate configuration is over the insulative level. The select gate configuration includes a second stack comprising alternating second dielectric levels and second conductive levels. Channel material pillars extend through the first stack and into the second stack. Some of the channel material pillars are associated with a first sub-block, and others of the channel material pillars being associated with a second sub-block. Memory cells are along the channel material pillars. An opening extends through the second stack, but not entirely through the insulative level. The opening, along a cross-section, has a first side and an opposing second side. A first conductive lining is along the first side of the opening and couples the second conductive levels along the first side of the opening into a first select gate for the first sub-block. A second conductive lining is along the second side of the opening and couples the second conductive levels along the second side of the opening into a second select gate for the second sub-block.

Some embodiments include a method of forming an assembly. A stack of alternating first and second levels is formed. The first levels comprise dielectric material and the second levels comprise sacrificial material. Two of the uppermost second levels are gate levels, and a first level between said two of the uppermost second levels is an intervening first level. At least some of the second levels beneath the gate levels are wordline levels. Channel material pillars are formed to extend through the wordline levels, through at least one of the gate levels, and through the intervening first level. Slits are formed to extend through the stack. The sacrificial material of the second levels is replaced with first conductive material, and then the slits are filled with insulative material. A first opening is formed to extend through the first conductive material of at least one of the gate levels, and to extend through the intervening first level. The first opening defines a first gate side along a first side of the first opening, and defines a second gate side along a second side of the first opening. The second side of the first opening is in opposing relation to the first side of the first opening along a cross-section. The dielectric material is removed from the intervening first level to form a first void along the first side of the first opening, and to form a second void along the second side of the first opening. Second conductive material is formed within the first opening and within the first and second voids. The second conductive material within the first void is an additional gate level along the first gate side, and the second conductive material within the second void is an additional gate level along the second gate side. Some of the second conductive material is removed to form a second opening which isolates the gate levels of the first gate side from the gate levels of the second gate side. A first conductive structure is formed within the second opening and along the first gate side. The first conductive structure couples the gate levels along the first gate side with one another to incorporate the gate levels along the first gate side into a first conductive gate. A second conductive structure is formed within the second opening and along the second gate side. The second conductive structure couples the gate levels along the second gate side with one another to incorporate the gate levels along the second gate side into a second conductive gate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An assembly, comprising:
    a first stack comprising alternating first dielectric levels and first conductive levels;
    a first conductive liner surrounding each of the first conductive levels, the first conductive liner comprising electrically conductive material;
    an insulative level over the first stack;
    a select gate configuration over the insulative level; the select gate configuration including a second stack comprising alternating second dielectric levels and second conductive levels;
    channel material pillars extending through the first stack and into the second stack; some of the channel material pillars being associated with a first sub-block and others of the channel material pillars being associated with a second sub-block;
memory cells along the channel material pillars;
an opening extending through the second stack, but not entirely through the insulative level; the opening, along a cross-section, having a first side and an opposing second side;
a first conductive lining along the first side of the opening and coupling the second conductive levels along the first side of the opening into a first select gate for the first sub-block; and
a second conductive lining along the second side of the opening and coupling the second conductive levels along the second side of the opening into a second select gate for the second sub-block.

2. The assembly of claim 1 wherein the memory cells are NAND memory cells.

3. The assembly of claim 1 wherein the opening penetrates into the insulative level.

4. The assembly of claim 1 wherein the first and second conductive linings are a same composition as one another.

5. The assembly of claim 4 wherein the first and second conductive linings comprise metal.

6. The assembly of claim 4 wherein the first and second conductive linings comprise tungsten.

7. The assembly of claim 1 wherein insulative material is within the opening between the first and second conductive linings.

8. The assembly of claim 1 wherein the second dielectric levels comprise one or more high-k oxides.

9. The assembly of claim 1 wherein the second dielectric levels comprise silicon dioxide.

10. The assembly of claim 1 wherein the memory cells comprise charge-blocking material, and wherein the second dielectric levels comprise a same composition as the charge-blocking material.

11. The assembly of claim 1 further comprising a second liner surrounding each of the second conductive levels.

12. The assembly of claim 11 wherein the second liner comprises conductive material.

13. The assembly of claim 12 wherein the conductive material of the second liner comprises a composition different from a composition of the second conductive levels.

14. The assembly of claim 11 wherein the second liner comprises a single structure of material and contacts at least two different sides of each of the second conductive levels.

15. The assembly of claim 14 wherein the at least two different sides of the second conductive levels are connected.

16. The assembly of claim 1 wherein the conductive material of the first conductive liner comprises a composition different from a composition of the first conductive levels.

17. The assembly of claim 1 wherein the first conductive liner comprises a single structure of material.

18. The assembly of claim 17 wherein the first conductive liner contacts at least two different sides of each of the first conductive levels.

19. The assembly of claim 18 wherein the at least two different sides of the first conductive levels are connected.

20. An assembly, comprising:
a first stack comprising alternating first dielectric levels and first conductive levels;
a gate level within at least two of the first dielectric levels;
a liner comprising a single structure of material and contacting at least two different sides of the gate level;
an insulative level over the first stack;
a select gate configuration over the insulative level; the select gate configuration including a second stack comprising alternating second dielectric levels and second conductive levels;
channel material pillars extending through the first stack and into the second stack; some of the channel material pillars being associated with a first sub-block and others of the channel material pillars being associated with a second sub-block;
memory cells along the channel material pillars;
an opening extending through the second stack, but not entirely through the insulative level; the opening, along a cross-section, having a first side and an opposing second side;
a first conductive lining along the first side of the opening and coupling the second conductive levels along the first side of the opening into a first select gate for the first sub-block;
a second conductive lining along the second side of the opening and coupling the second conductive levels along the second side of the opening into a second select gate for the second sub-block; and
wherein the liner contacts at least three different sides of the gate level.

21. The assembly of claim 20 wherein the gate level comprises a first conductive composition and a second conductive composition different from the first conductive composition.

22. The assembly of claim 20 wherein the gate level comprises:
a core of conductive material; and
wherein the liner comprises conductive material surrounding the core.

23. The assembly of claim 22 wherein the conductive material of the core is different from the conductive material of the liner.

24. The assembly of claim 20 wherein the at least two different sides of the gate level are connected.

25. The assembly of claim 20 wherein the at least three different sides of the gate level are serially connected.

26. An assembly, comprising:
a first stack comprising alternating first dielectric levels and first conductive levels;
a first conductive liner surrounding each of the first conductive levels;
an insulative level over the first stack;
a select gate configuration over the insulative level; the select gate configuration including a second stack comprising alternating second dielectric levels and second conductive levels;
channel material pillars extending through the first stack and into the second stack; some of the channel material pillars being associated with a first sub-block and others of the channel material pillars being associated with a second sub-block;
memory cells along the channel material pillars;
an opening extending through the second stack, but not entirely through the insulative level; the opening, along a cross-section, having a first side and an opposing second side;
a first conductive lining along the first side of the opening and coupling the second conductive levels along the first side of the opening into a first select gate for the first sub-block;
a second conductive lining along the second side of the opening and coupling the second conductive levels along the second side of the opening into a second select gate for the second sub-block;

a second liner surrounding each of the second conductive levels; and wherein the second liner comprises a single structure of material and contacts at least two different sides of each of the second conductive levels.

27. The assembly of claim 26 wherein the first conductive liner is electrically conductive.

* * * * *